United States Patent
Park et al.

(10) Patent No.: US 7,513,656 B2
(45) Date of Patent: Apr. 7, 2009

(54) OPTICAL LENS SYSTEM, BACKLIGHT ASSEMBLY AND DISPLAY DEVICE

(75) Inventors: Se-Ki Park, Suwon-si (KR); Ju-Young Yoon, Suwon-si (KR); Sang-Yu Lee, Yongin-si (KR); Gi-Cherl Kim, Yongin-si (KR); Seok-Hyun Nam, Seoul (KR); Sang-Gil Lee, Seoul (KR); Jong-Seo Lee, Hwaseong-si (KR); Chun-Ho Song, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 110 days.

(21) Appl. No.: 11/251,335

(22) Filed: Oct. 15, 2005

(65) Prior Publication Data

US 2006/0164838 A1 Jul. 27, 2006

(30) Foreign Application Priority Data

Jan. 27, 2005 (KR) .................. 10-2005-0007574

(51) Int. Cl.
*F21V 5/04* (2006.01)
(52) U.S. Cl. .............. 362/333; 362/311; 362/334; 257/95; 257/98
(58) Field of Classification Search ............. 362/333, 362/97, 311, 331, 332, 334; 257/98, 95, 257/89; 349/61
See application file for complete search history.

(56) References Cited

U.S. PATENT DOCUMENTS

| 2,362,176 | A | * | 11/1944 | Swanson | 313/110 |
| 4,013,915 | A | * | 3/1977 | Dufft | 313/112 |
| 4,698,730 | A | * | 10/1987 | Sakai et al. | 362/311 |
| 5,894,195 | A | * | 4/1999 | McDermott | 362/311 |
| 6,547,423 | B2 | * | 4/2003 | Marshall et al. | 362/333 |
| 6,661,029 | B1 | * | 12/2003 | Duggal | 257/89 |
| 6,755,556 | B2 | * | 6/2004 | Gasquet et al. | 362/329 |
| 7,052,152 | B2 | * | 5/2006 | Harbers et al. | 362/30 |
| 2002/0097354 | A1 | * | 7/2002 | Greiner | 349/61 |
| 2005/0007516 | A1 | * | 1/2005 | Hong et al. | 349/64 |

* cited by examiner

*Primary Examiner*—Ismael Negron
(74) *Attorney, Agent, or Firm*—F. Chau & Associates, LLC.

(57) ABSTRACT

A display device includes an optical module, a receiving container and a display panel. The optical module includes a substrate, point light sources and an optical lens. The point light sources are disposed on the substrate, each of which generates light using power applied thereto through the substrate. The optical lens includes a first lens part having a receiving part receiving each of the point light sources, a second lens part disposed at a peripheral portion of the first lens part and having a different shape from that of the first lens part, and a connecting part connecting the first and second lens parts. The light from each of the point light sources sequentially passes through the first lens part and the second lens part. The receiving container receives the optical module. The display panel displays an image using the light.

25 Claims, 10 Drawing Sheets

OPTICAL LENS SYSTEM, BACKLIGHT ASSEMBLY AND DISPLAY DEVICE

CROSS-REFERENCE TO RELATED APPLICATIONS

This application claims priority to Korean Patent Application No. 2005-7574, filed on Jan. 27, 2005, the content of which is hereby incorporated by reference in its entirety.

BACKGROUND OF THE INVENTION

1. Field of the Invention

The present invention relates to an optical lens system, an optical module having the optical lens, a backlight assembly having the optical lens, and a display device having the optical lens. More particularly, the present invention relates to an optical lens system capable of improving optical characteristics, an optical module having the optical lens, a backlight assembly having the optical lens, and a display device having the optical lens.

2. Description of the Related Art

Generally, a display device is a device for visual presentation of images acquired, stored, or transmitted in various forms. Common display device types are analog electronic displays, such as a cathode ray tube (CRT) display, and digital electronic displays, including liquid crystal display (LCD), plasma display panel (PDP), and organic electroluminescence display (OELD).

An LCD displays an image using liquid crystal molecules. LCDs can be transmissive, reflective, or transflective (a combination of reflective and transmissive types), depending on the location of the light source. A transmissive LCD is illuminated by a backlight. This type of LCD is widely used in computer displays, mobile phones and other applications requiring high luminance levels. Reflective LCDs are illuminated by external light reflected by a diffusing reflector behind the display. Transflective LCDs can work as either transmissive or reflective LCDs, i.e., transmissively when light levels are low, using a backlight, and reflectively when external light levels are high.

Backlit and edgelit LCDs have their own light source. Examples of light sources include: light emitting diode (LED), cold cathode fluorescent lamp (CCFL), and flat fluorescent lamp (FFL). Luminous efficacy is commonly used as a metric to evaluate a light source. Luminous efficiency is a measure of the proportion of the energy supplied to a lamp that is converted into light energy. It is calculated by dividing the lamp's luminous flux, measured in lumens, by the power consumption, measured in watts.

The luminous efficacy of an LED is greater than that of a CCFL or FFL, while power consumption of an LED is lower than that of a CCFL or FFL. However, optical luminance uniformity of an LED is lower than that of the CCFL or FFL. Therefore, use of an LED as a light source causes a poor display quality of the LCD device.

SUMMARY OF THE INVENTION

Exemplary embodiments of the present invention provide an optical lens system capable of improving optical characteristics such as optical luminance and optical luminance uniformity.

According to exemplary embodiments of the present invention, an optical lens system includes a first lens part and a second lens part. The first lens part includes a receiving part receiving a point light source. The second lens part has a wall shape and is disposed at a peripheral portion of the first lens part The second lens part has a different shape from that of the first lens part. Light from the point light source sequentially passes through the first lens part and the second lens part.

According to exemplary embodiments of the present invention, an optical lens system includes a first lens unit and a second lens unit. The first lens unit includes a receiving part receiving a point light source. The second lens unit includes a lens part surrounding the first lens unit and a connecting part extended from an inner lateral face of the lens part and having an opening formed thereon, the connecting part connecting the inner lateral face of the lens part with an outer lateral face of the first lens unit through the opening.

According to one aspect of the present invention, an optical module includes a substrate, point light sources and an optical lens. The point light sources are disposed on the substrate, each of which generates colored light using a power applied thereto through the substrate. The optical lens includes a first lens part including a receiving part receiving each of the point light sources, and a second lens part disposed at a peripheral portion of the first lens part. The second lens part has a different shape from that of the first lens part. The colored light from each of the point light sources sequentially passes through the first lens part and the second lens part.

According to another aspect of the present invention, a backlight assembly includes an optical module and a receiving container. The optical module includes a substrate, point light sources and an optical lens. The point light sources are disposed on the substrate, each of which generates colored light using power applied thereto through the substrate. The optical lens includes a first lens part including a receiving part receiving each of the point light sources, a second lens part disposed at a peripheral portion of the first lens part, and a connecting part connecting the first and second lens parts. The second lens part has a different shape from that of the first lens part. The colored light from each of the point light sources sequentially passes through the first lens part and the second lens part. The receiving container receives the optical module.

According to still another aspect of the present invention, a display device includes an optical module, a receiving container, a light-diffusing plate and a display panel. The optical module includes a substrate, point light sources and an optical lens. The point light sources are disposed on the substrate, each of which generates light using power applied thereto through the substrate. The optical lens includes a first lens part including a receiving part receiving each of the point light sources, a second lens part disposed at a peripheral portion of the first lens part and having a different shape from that of the first lens part, and a connecting part connecting the first and second lens parts with each other. The light from each of the point light sources sequentially passes through the first lens part and the second lens part. The receiving container is configured to receive the optical module. The light-diffusing plate is disposed over the optical module to diffuse the light. The display panel is disposed over the light-diffusing plate to display an image using the diffused light.

BRIEF DESCRIPTION OF THE DRAWINGS

The present invention will become more apparent to those of ordinary skill in the art when descriptions of exemplary embodiments thereof are read with reference to the accompanying drawings, of which.

DETAILED DESCRIPTION OF THE EXEMPLARY EMBODIMENTS

Hereinafter, the present invention will be described in detail with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. Like reference numerals refer to similar or identical elements throughout the description of the figures.

Figure 1:
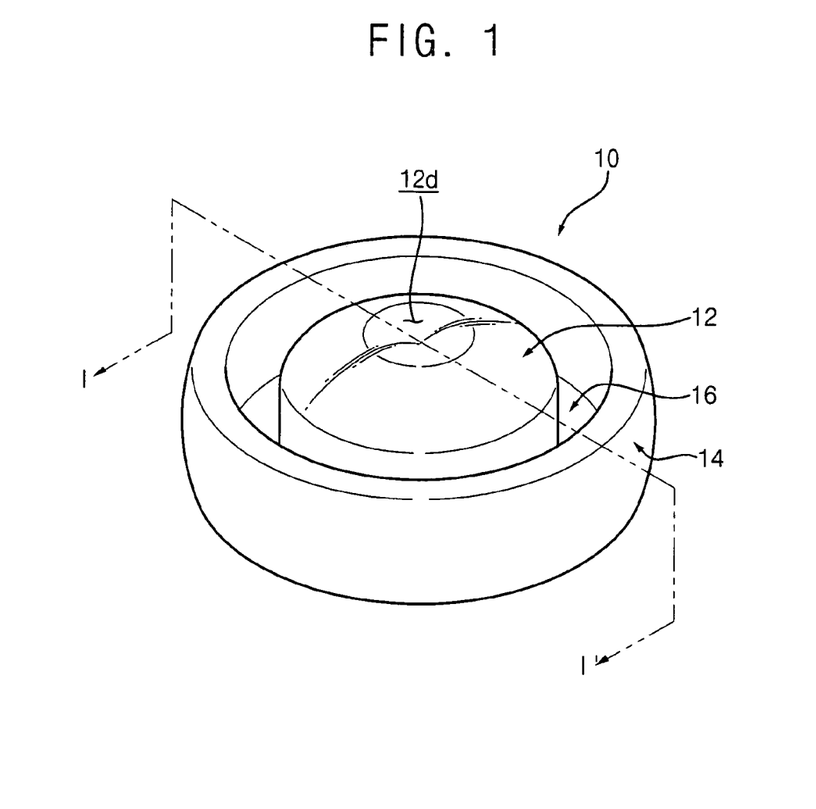
FIG. 1 is a perspective view illustrating an optical lens according to a first exemplary embodiment of the present invention.
Figure 2:
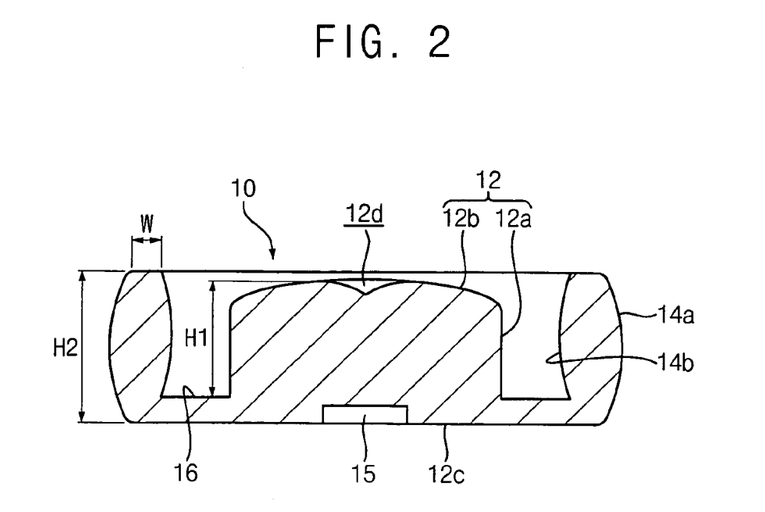
FIG. 2 is a cross-sectional view taken along a line I-I' in FIG. 1.

FIG. 1 is a perspective view illustrating an optical lens according to a first exemplary embodiment of the present invention. FIG. 2 is a cross-sectional view taken along a line I-I' in FIG. 1.

Referring to FIGS. 1 and 2, an optical lens 10 includes a first lens part 12, a second lens part 14 and a connecting part 16. The first lens part 12 includes a lateral face 12a and an upper face 12b. A recess portion 12d is formed on the upper face 12b of the first lens part 12. The first lens part 12 may have various shapes. In an embodiment of the present invention, the lateral face 12a of the first lens part 12 has a circular cylindrical shape, and the upper face 12b of the first lens part 12 has a dome shape. Alternatively, the lateral face 12a of the first lens part 12 may have a truncated cone shape, a polygonal cylindrical shape, a truncated polygonal pyramid, etc. The height of the first lens part 12 is less than the width of the first lens part 12.

A receiving part 15 is formed on the bottom face 12c of the optical lens 10 facing the upper face 12b of the first lens part 12. The receiving part 15 receives a point light source. In at least one embodiment of the present invention, the point light source is an LED. It should be appreciated that any point light source should be suitable for implementing the invention. According to an embodiment of the present invention, the receiving part 15 has a recess shape to receive the point light source having a semiconductor chip shape.

As shown in FIG. 1, the second lens part 14 is disposed at a peripheral portion of the first lens part 12. The second lens part 14 surrounds at least a portion of the first lens part 12. In an embodiment of the present invention, the second lens part 14 entirely surrounds the first lens part 12. Alternatively, the second lens part 14 may partially surround the first lens part 12. The second lens part 14 has a different shape from that of the first lens part 12. The second lens part 14 has a circular tube shape or a cylindrical shape. The height of the second lens part 14 is greater than the width of the second lens part 14. The first lens part 12 is disposed inside the second lens part 14.

In an embodiment of the present invention, a first convex portion 14a is formed on an outer lateral face of the second lens part 14, and a second convex portion 14b is formed on an inner lateral face of the second lens part 14. In an embodiment of the present invention, a first curvature of the first convex portion 14a is greater than a second curvature of the second convex portion 14b. Alternatively, a convex portion may be formed on either the outer lateral face or the inner lateral face of the second lens part 14.

An upper face of the second lens part 14, in an embodiment of the present invention, has a width W of no more than about 1.0 mm. The amount of light passing through the second lens part 14 decreases when the width W of the upper face of the second lens part 14 is above about 1.0 mm.

Light from the point light source sequentially passes through the first lens part 12 and the second lens part 14. The first lens part 12 expands the light emitted from the point light source in a first direction, and the second lens part 14 expands the expanded light in a second direction that is different from the first direction. For example, the first direction corresponds to a width direction of the first lens part 12, and the second direction corresponds to a height direction of the second lens part 14. The first direction may be substantially perpendicular to the second direction.

The connecting part 16 connects the first and second lens parts 12 and 14 with each other. The first and second lens parts 12 and 14 may be integrally formed with each other through the connecting part 16. The connecting part 16 connects the lateral face 12a of the first lens part 12 and the inner lateral face of the second lens part 14. A center of the first lens part 12 is aligned with a center of the second lens part 14 by the connecting part 16, so that eccentricity of light from the optical lens 10 is prevented.

As shown in FIG. 2, a first height H1 from an upper face of the connecting part 16 to a vertex of the first lens part 12 is lower than a second height H2 from a lower face of the connecting part 16 to the upper face of the second lens part 12.

In accordance with an embodiment of the present invention, the first and second lens parts 12 and 14 are substantially parallel to each other. The second lens part 14 is substantially perpendicular to the connecting part 16.

Figure 3:
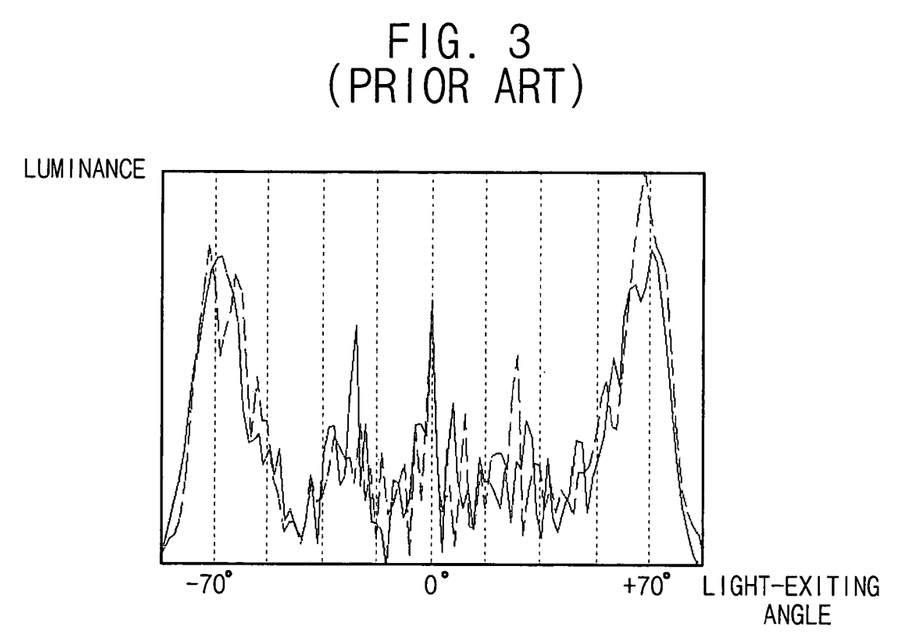
FIG. 3 is a graph illustrating an optical distribution of a conventional optical lens.
Figure 4:
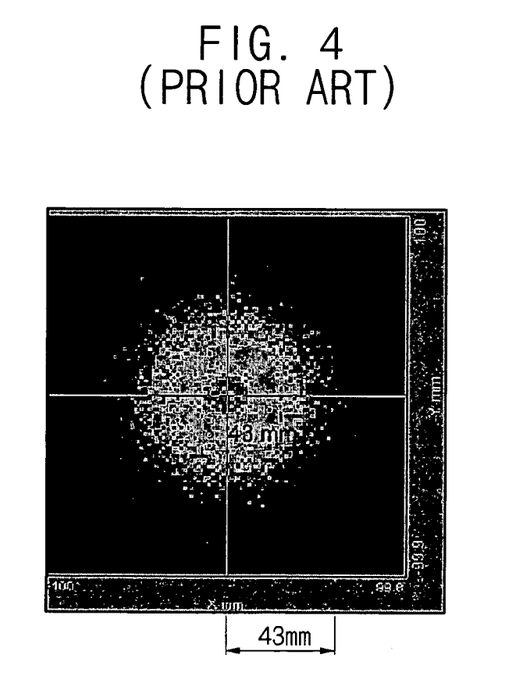
FIG. 4 is a graph illustrating an optical luminance distribution of a conventional optical lens.
Figure 5:
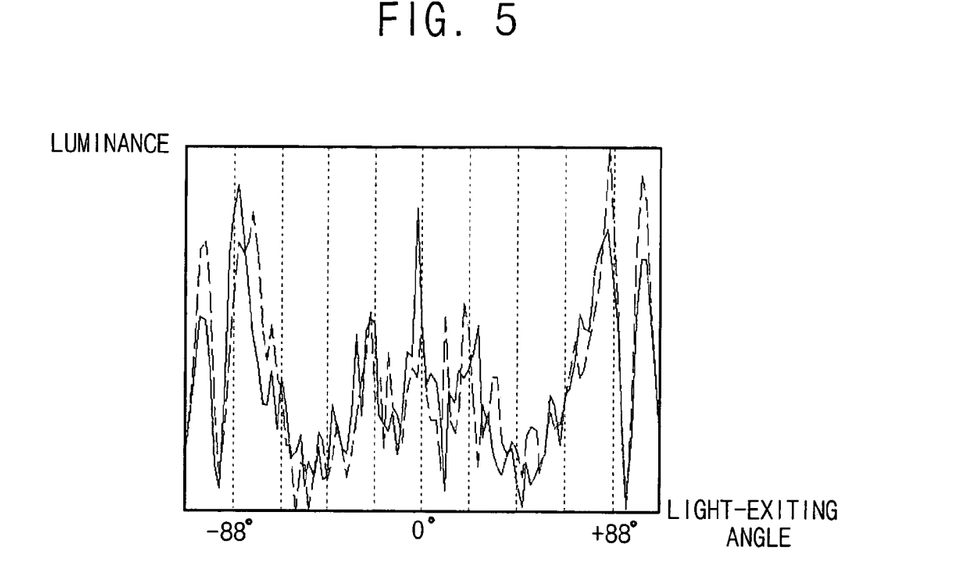
FIG. 5 is a graph illustrating an optical distribution of the optical lens shown in FIG. 1.
Figure 6:
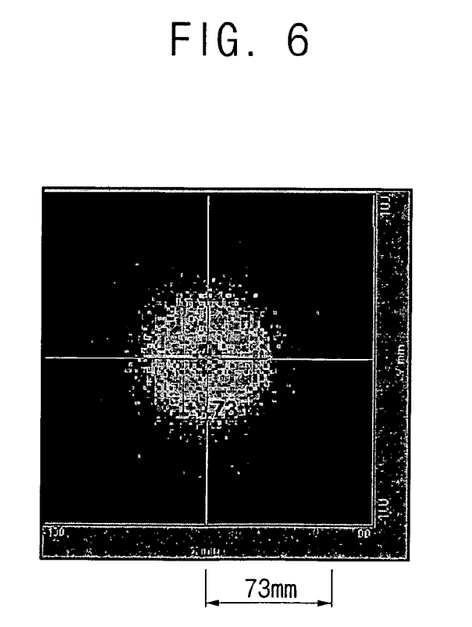
FIG. 6 is a graph illustrating an optical luminance distribution of the optical lens shown in FIG. 1.

FIG. 3 is a graph illustrating an optical distribution of a conventional optical lens. FIG. 4 is a graph illustrating an optical luminance distribution of a conventional optical lens. FIG. 5 is a graph illustrating an optical distribution of the optical lens shown in FIG. 1. FIG. 6 is a graph illustrating an optical luminance distribution of the optical lens shown in FIG. 1.

Referring to FIG. 3, the X-axis represents a light-exiting angle of light emitted from a conventional optical lens on the basis of a reference line that is substantially perpendicular to a bottom face of the optical lens. The Y-axis represents luminance of the light emitted from the optical lens.

Referring to FIGS. 3 and 4, when most of the light emitted from the optical lens has a light-exiting angle of about −70° or about +70° with respect to the reference line shown in FIG. 3, an effective area of the light is substantially the same as a circular area having a diameter of about 43 mm as shown in FIG. 4.

Referring to FIG. 5, the X-axis represents a light-exiting angle of light emitted from the optical lens 10 of the present embodiment on the basis of a reference line that is substantially perpendicular to the bottom face 12c of the optical lens 10. The Y-axis represents luminance of the light emitted from the optical lens 10.

Referring to FIG. 6, when most of the light emitted from the conventional optical lens has a light-exiting angle of about −88° or about +88° with respect to the reference line, an effective area of the light is substantially the same as a circular area having a diameter of about 73 mm.

Therefore, the optical lens 10 including the first and second lens parts 12 and 14 has an optical luminance uniformity greater than that of the conventional optical lens.

Figure 7:
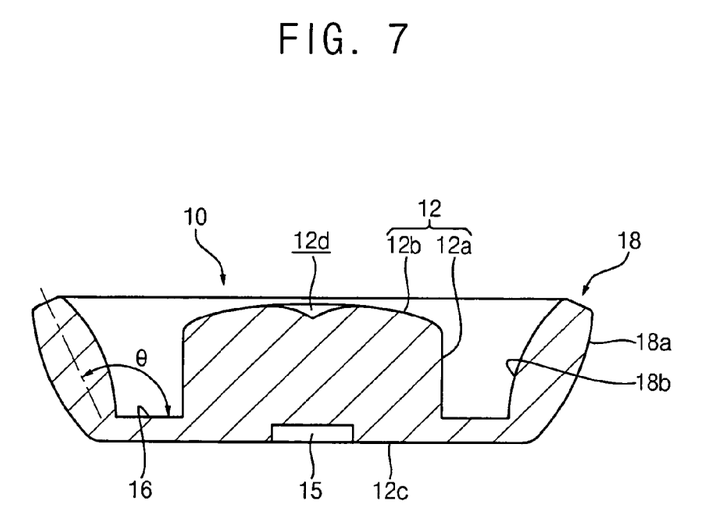
FIG. 7 is a cross-sectional view illustrating an optical lens according to a second exemplary embodiment of the present invention.

FIG. 7 is a cross-sectional view illustrating an optical lens according to a second exemplary embodiment of the present invention.

Referring to FIG. 7, the second lens part 18 is disposed at a peripheral portion of the first lens part 12. The second lens part 18 is disposed at a peripheral portion of the first lens part 12. The second lens part 18 surrounds at least a portion of the first lens part 12. In an embodiment of the present invention, the second lens part 18 entirely surrounds the first lens part 12. Alternatively, the second lens part 18 may partially surround the first lens part 12. The second lens part 18 has a different shape from that of the first lens part 12. The second lens part 18, for example, has a circular tube shape or a cylindrical shape. The height of the second lens part 18 is greater than the width of the second lens part 18. The first lens part 12 is disposed inside the second lens part 18.

In an embodiment of the present invention, a first convex portion 18a is formed on an outer lateral face of the second lens part 18, and a second convex portion 18b is formed on an inner lateral face of the second lens part 18. In an embodiment of the present invention, a first curvature of the first convex portion 18a is greater than a second curvature of the second convex portion 18b.

In an embodiment of the present invention, the second lens part 18 has an obtuse angle θ with respect to an upper face of the connecting part 16. Thus, luminance uniformity of light emitted from the second lens part 18 may be improved.

Light from the point light source sequentially passes through the first lens part 12 and the second lens part 18. The first lens part 12 expands the light emitted from the point light source in a first direction, and the second lens part 18 expands the expanded light in a second direction that is different from the first direction. In an embodiment of the present invention, the first direction corresponds to a width direction of the first lens part 12, and the second direction corresponds to a height direction of the second lens part 18. The first direction may be substantially perpendicular to the second direction.

Figure 8:
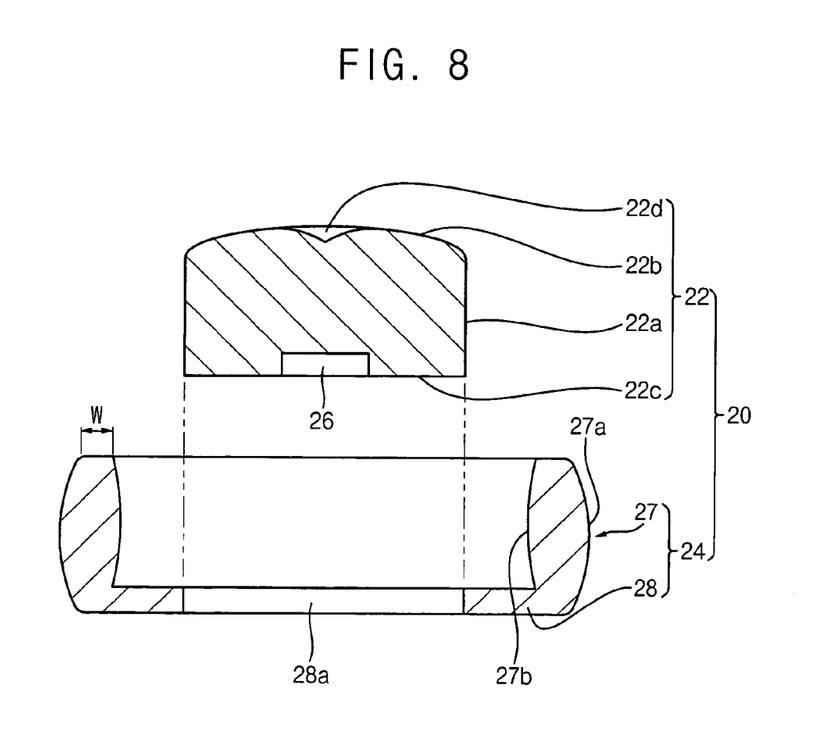
FIG. 8 is an exploded cross-sectional view illustrating an optical lens according to a third exemplary embodiment of the present invention.

FIG. 8 is an exploded cross-sectional view illustrating an optical lens according to a third exemplary embodiment of the present invention.

Referring to FIG. 8, an optical lens 20 includes a first lens unit 22 and a second lens unit 24. The first lens unit 22 includes a lateral face 22a, an upper face 22b and a bottom face 22c. As illustrated in FIG. 8, a recess portion 22d is formed on the upper face 22b of the first lens unit 22. The first lens unit 22 may have various shapes. In an embodiment of the present invention, the lateral face 22a of the first lens unit 22 has a circular cylindrical shape, and the upper face 22b of the first lens unit 22 has a dome shape. Alternatively, the lateral face 22a of the first lens unit 22 may have a truncated cone shape, a polygonal cylindrical shape, a truncated polygonal pyramid, etc. The height of the first lens unit 22 is less than the width of the first lens unit 22.

A receiving part 26 is formed on the bottom face 22c facing the upper face 22b of the first lens unit 22. The receiving part 26 receives a point light source. In at least one embodiment of the present invention, the point light source is an LED. According to an embodiment of the present invention, the receiving part 26 has a recess shape to receive the point light source having a semiconductor chip shape.

The second lens unit 24 is combined with the first lens unit 22. The second lens unit 24 combined with the first lens unit 22 includes a lens part 27 disposed at a peripheral portion of the first lens unit 22 and a connecting part 28. The lens part 27 surrounds at least a portion of the first lens unit 22. The lens part 27 entirely surrounds the first lens unit 22. Alternatively, the lens part 27 may partially surround the first lens unit 22.

The lens part 27 of the second lens unit 24 has a different shape from that of the first lens unit 22. The lens part 27 of the second lens unit 24, in an embodiment of the present invention, has a circular tube shape or a cylindrical shape. The height of the lens part 27 is greater than the width of the lens part 27. A first convex portion 27a is formed on an outer lateral face of the lens part 27, and a second convex portion 27b is formed on an inner lateral face of the lens part 27.

In an embodiment of the present invention, the first convex portion 27a has a first curvature, and the second convex portion 27b has a second curvature that is greater than the first curvature. Alternatively, a convex portion may be formed on either the outer lateral face or the inner lateral face of the lens part 27.

In an embodiment of the present invention, an upper face of the lens part 27 preferably has a width W of below about 1.0 mm. The amount of light passing through the lens part 27 decreases when the width W of the upper face of the lens part 27 is above about 1.0 mm.

Light from the point light source sequentially passes through the first lens unit 22 and the lens part 27 of the second lens unit 24. The first lens unit 22 expands the light emitted from the point light source in a first direction, and the lens part 27 of the second lens unit 24 expands the expanded light in a second direction that is different from the first direction. In an embodiment of the present invention, the first direction corresponds to a width direction of the first lens unit 22, and the second direction corresponds to a height direction of the lens part 27 of the second lens unit 24. The first direction may be substantially perpendicular to the second direction.

The connecting part 28 integrally formed with the lens part 27 connects the lateral face 22a of the first lens unit 22 and the lens part 27.

In an embodiment of the present invention, an opening 28a is formed at center portion of the connecting part 28 to combine the first and second lens units 22 and 24 with each other. The opening 28a, for example, is a recess or a throughhole formed on the connecting part 28. An open face of the opening 28a of the connecting part 28 and the lateral face 22a of the first lens unit 22 may be combined with each other using an adhesive member. Alternatively, the open face of the opening 28a of the connecting part 28 and the lateral face 22a of the first lens unit 22 may be combined with each other using a screw.

In an embodiment of the present invention, the first lens unit 22 and the lens part 27 of the second lens unit 24 are substantially perpendicular to the connecting part 28. Alternatively, the lens part 27 of the second lens unit 24 may have an obtuse angle with respect to the connecting part 28.

Figure 9:
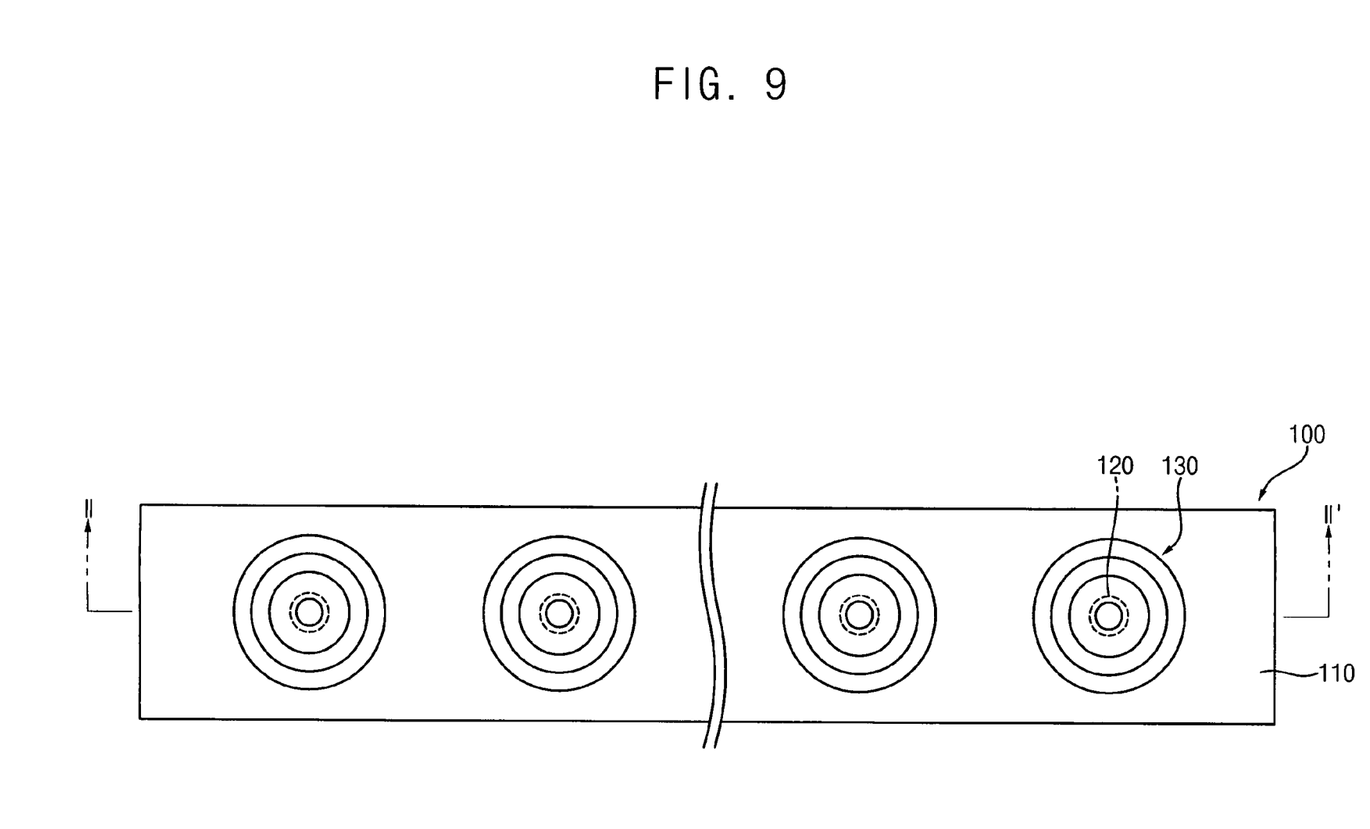
FIG. 9 is a plan view illustrating an optical module according to a fourth exemplary embodiment of the present invention.
Figure 10:
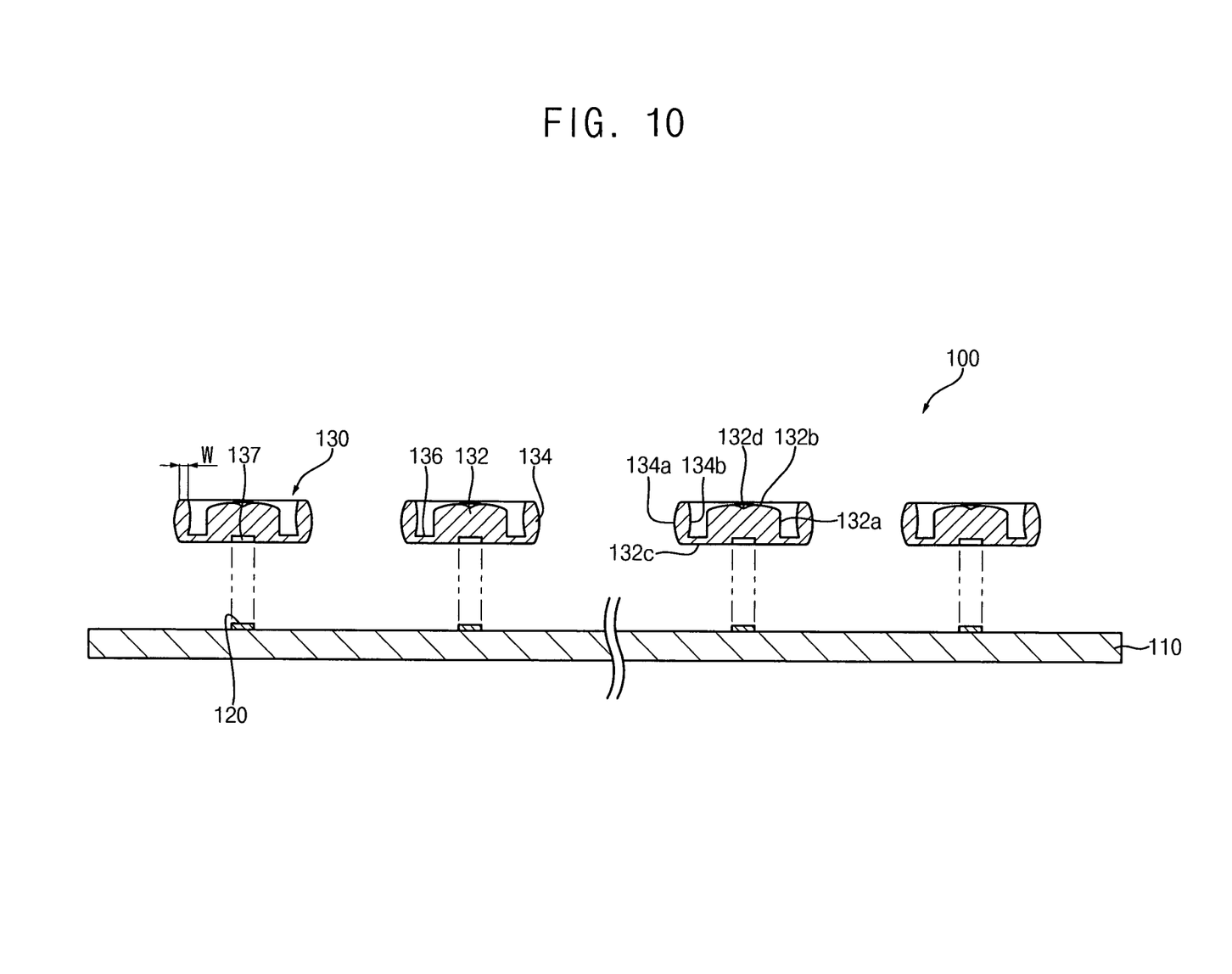
FIG. 10 is a cross-sectional view taken along a line II-II' in FIG. 9.

FIG. 9 is a plan view illustrating an optical module according to a fourth exemplary embodiment of the present invention. FIG. 10 is a cross-sectional view taken along a line II-II' in FIG. 9.

Referring to FIGS. 9 and 10, an optical module 100 includes a substrate 110, point light sources 120 and optical lenses 130. The point light sources 120 and optical lenses 130 are disposed on the substrate 110. Power is applied to the point light sources 120 through the substrate 110. Thus the point light sources 120 generate light. The point light sources 120 generate colored light using the power. The colored light, for example, includes red light, green light and blue light. The point light sources 120, for example, includes a red LED emitting red light, a green LED emitting green light and a blue LED emitting blue light to generate the colored light.

Heat is also generated from the point light sources 120. The substrate 110, for example, includes a printed circuit board (PCB) on which metal having high electrical conductivity is coated. Thus, the substrate 110 rapidly emits the heat generated from the point light sources 120.

Each optical lens 130 covers each point light source 120 disposed on the substrate 110, the colored light generated from the point light sources 120 is emitted through the optical lenses 130. The optical lens 130 includes a first lens part 132, a second lens part 134 and a connecting part 136.

The first lens part 132 includes a lateral face 132a and an upper face 132b. A recess portion 132d is formed at the upper face 132b of the first lens part 132. The first lens part 132 may have various shapes. In an embodiment of the present invention, the lateral face 132a of the first lens part 132 has a circular cylindrical shape, and the upper face 132b of the first lens part 132 has a dome shape. Alternatively, the lateral face 132a of the first lens part 132 may have a truncated cone shape, a polygonal cylindrical shape, a truncated polygonal pyramid, etc. The height of the first lens part 132 is less than the width of the first lens part 132.

As shown in FIG. 10, receiving part 137 is formed on the bottom face 132c of the optical lens 130 facing the upper face 132b of the first lens part 132. The receiving part 137 receives the point light source 120. In at least one embodiment of the present invention, the point light source 120 is an LED. According to an embodiment of the present invention, the receiving part 137 has a recess shape to receive the point light source 120 having a semiconductor chip shape.

The second lens part 134 disposed at a peripheral portion of the first lens part 132. The second lens part 134 surrounds at least a portion of the first lens part 132. In an embodiment of the present invention, the second lens part 134 entirely surrounds the first lens part 132. Alternatively, the second lens part 134 may partially surround the first lens part 132. The second lens part 134 has a different shape from that of the first lens part 132. The second lens part 134, for example, has a circular tube shape or a cylindrical shape. A height of the second lens part 134 is greater than a width of the second lens part 134. The first lens part 132 is disposed inside the second lens part 134.

In an embodiment of the present invention, a first convex portion 134a is formed on an outer lateral face of the second lens part 134, and a second convex portion 134b is formed on an inner lateral face of the second lens part 134. In an embodiment of the present invention, the first convex portion 134a has a first curvature, and the second convex portion 134b has a second curvature that is greater than the first curvature. Alternatively, a convex portion may be formed on either the outer lateral face or the inner lateral face of the second lens part 134.

An upper face of the second lens part 134, in an embodiment of the present invention, has a width W of below about 1.0 mm. The amount of light passing through the second lens part 134 decreases when the width W of the upper face of the second lens part 134 is above about 1.0 mm.

The colored light from the point light source 120 sequentially passes through the first lens part 132 and the second lens part 134. The first lens part 132 expands the colored light emitted from the point light source 120 in a first direction, and the second lens part 134 expands the expanded colored light in a second direction that is different from the first direction. In an embodiment of the present invention, the first direction corresponds to a width direction of the first lens part 132, and the second direction corresponds to a height direction of the second lens part 134. The first direction may be substantially perpendicular to the second direction.

The connecting part 136 connects the first and second lens parts 132 and 134. The first and second lens parts 132 and 134 may be integrally formed with each other through the connecting part 136. In detail, the connecting part 136 connects the lateral face 132a of the first lens part 132 and the inner lateral face of the second lens part 134 with each other. A center of the first lens part 132 is aligned with a center of the second lens part 134 by the connecting part 136, so that eccentricity of light from the optical lens 130 is prevented.

In an embodiment of the present invention the first and second lens parts 132 and 134 are substantially parallel to each other. The second lens part 134 is substantially perpendicular to the connecting part 136. Alternatively, the second lens part 134 may have an obtuse angle with respect to the connecting part 136.

Figure 11:
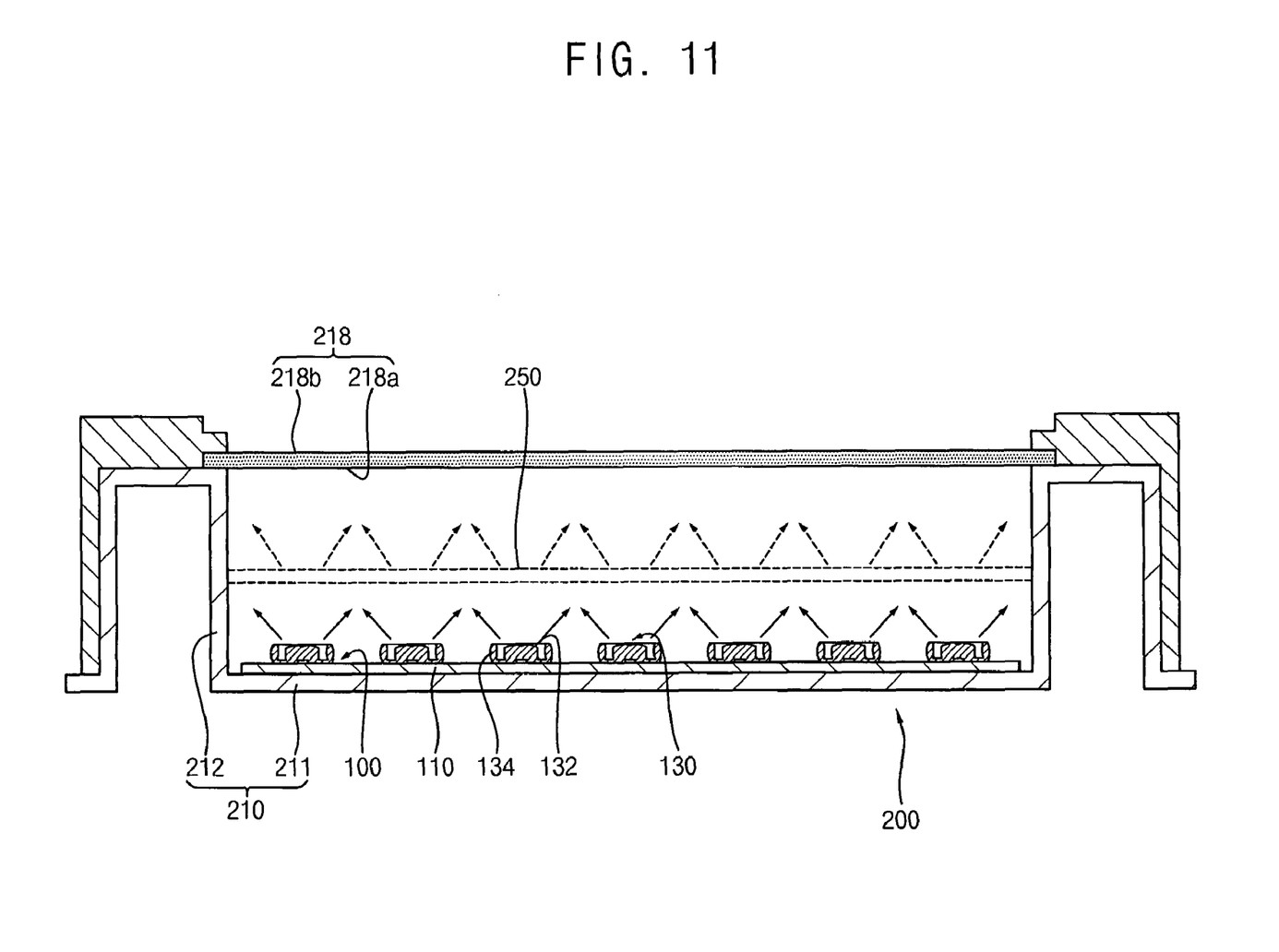
FIG. 11 is a cross-sectional view illustrating a backlight assembly according to a fifth exemplary embodiment of the present invention.

FIG. 11 is a cross-sectional view illustrating a backlight assembly according to a fifth exemplary embodiment of the present invention.

Referring to FIG. 11, a backlight assembly 200 includes an optical module 100 and a receiving container 210. The backlight assembly 200 optionally includes a light-mixing member 250, as shown by dotted lines in FIG. 11, and an optical member 218.

The optical member 218 according to the present invention includes a diffusion plate that diffuses an incident light. The diffusion plate has a light-incident face 218a and a light-exiting face 218b that is opposite to the light incident face 218a. The light incident face 218a has a rectangular shape viewed from a plan view.

The receiving container 210 includes a bottom plate 211 and sidewalls 212. In an embodiment of the present invention, a receiving container 210, is formed through bending a metallic plate.

The bottom plate 211 faces the light-incident face 218a of the optical member 218. The bottom plate 211, for example, has a rectangular shape corresponding to a shape of the light-incident face 218a.

The sidewalls 212 protrude from a peripheral portion of the bottom plate 211 toward the optical member 218. In an embodiment of the present invention, the bottom plate 211 of the receiving container 210 has a rectangular shape, and four sidewalls 212 are respectively disposed on four sides of the bottom plate 211.

The sidewalls 212 are disposed between the optical member 218 and the bottom plate 211 to define a receiving space.

The optical module 100 is disposed on an inner surface of the bottom plate 211 of the receiving container 210 to generate colored light such as red, green and blue light.

The light-mixing member 250 is disposed over the optical module 100. The light-mixing member 250 is disposed adjacent to the sidewalls 212 of the receiving container 210. The light-mixing member 212 is spaced apart from the bottom plate 211 to make contact with an inner lateral face of the sidewalls 212. The light-mixing member 250 mixes the colored light generated from the optical module 100, thereby generating white light. The colored light, for example, includes red, green and blue lights.

The optical member 218 is disposed over the light-mixing member 250. The white light emitted from the light-mixing member 250 is incident onto the light-incident face 218a of the optical member 218, and then is emitted from the light-exiting face 218b of the optical member 218. The optical member 218, in an embodiment of the present invention, includes a light-diffusing plate diffusing incident light. The optical member 218 has a rectangular shape.

Figure 12:
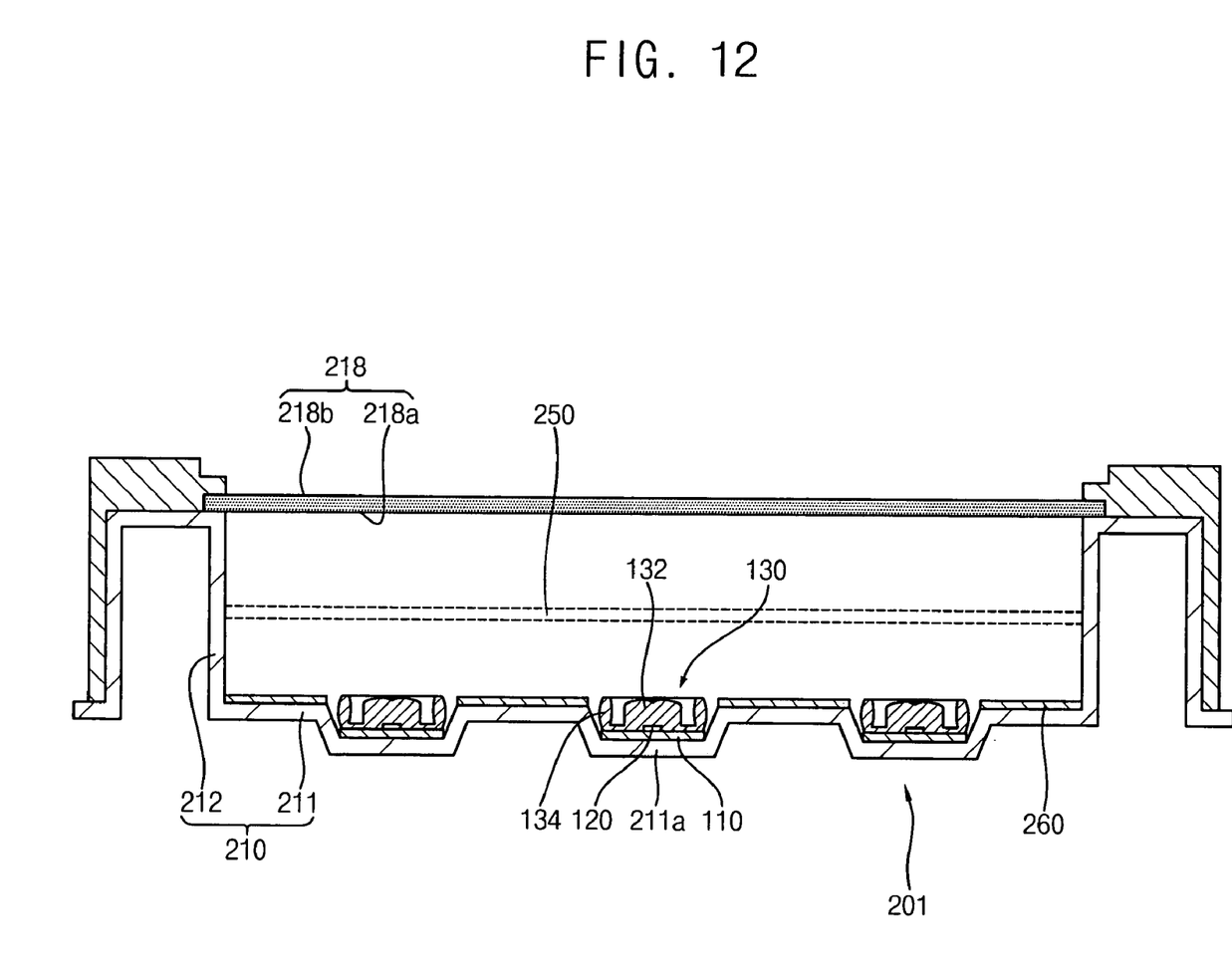
FIG. 12 is a cross-sectional view illustrating a backlight assembly according to a sixth exemplary embodiment of the present invention.

FIG. 12 is a cross-sectional view illustrating a backlight assembly according to a sixth exemplary embodiment of the present invention.

Referring to FIG. 12, a backlight assembly 201 according to the present embodiment includes a receiving part 211a formed on the bottom plate 211 of the receiving container 210 to receive the optical module 100.

The receiving part 211a corresponds to the optical module 100. In an embodiment of the present invention, at least two optical modules 100 are disposed in parallel on the bottom plate 211 of the receiving container 210, and the receiving part 211a is formed on a portion corresponding to the optical module 100. In an embodiment of the present invention, the receiving part 211a has a groove shape on the bottom plate 211.

When the receiving part 211a is formed on the bottom plate 211, an interval between the optical member 218 and the bottom plate 211 may decrease. Thus, a volume and a weight of the backlight assembly 201 may be reduced.

A light-reflecting sheet 260 is disposed on the bottom plate 211 to reflect light reflected from the light-mixing member 250, as shown by the dotted lines in FIG. 12, toward the light-mixing member 250.

Figure 13:
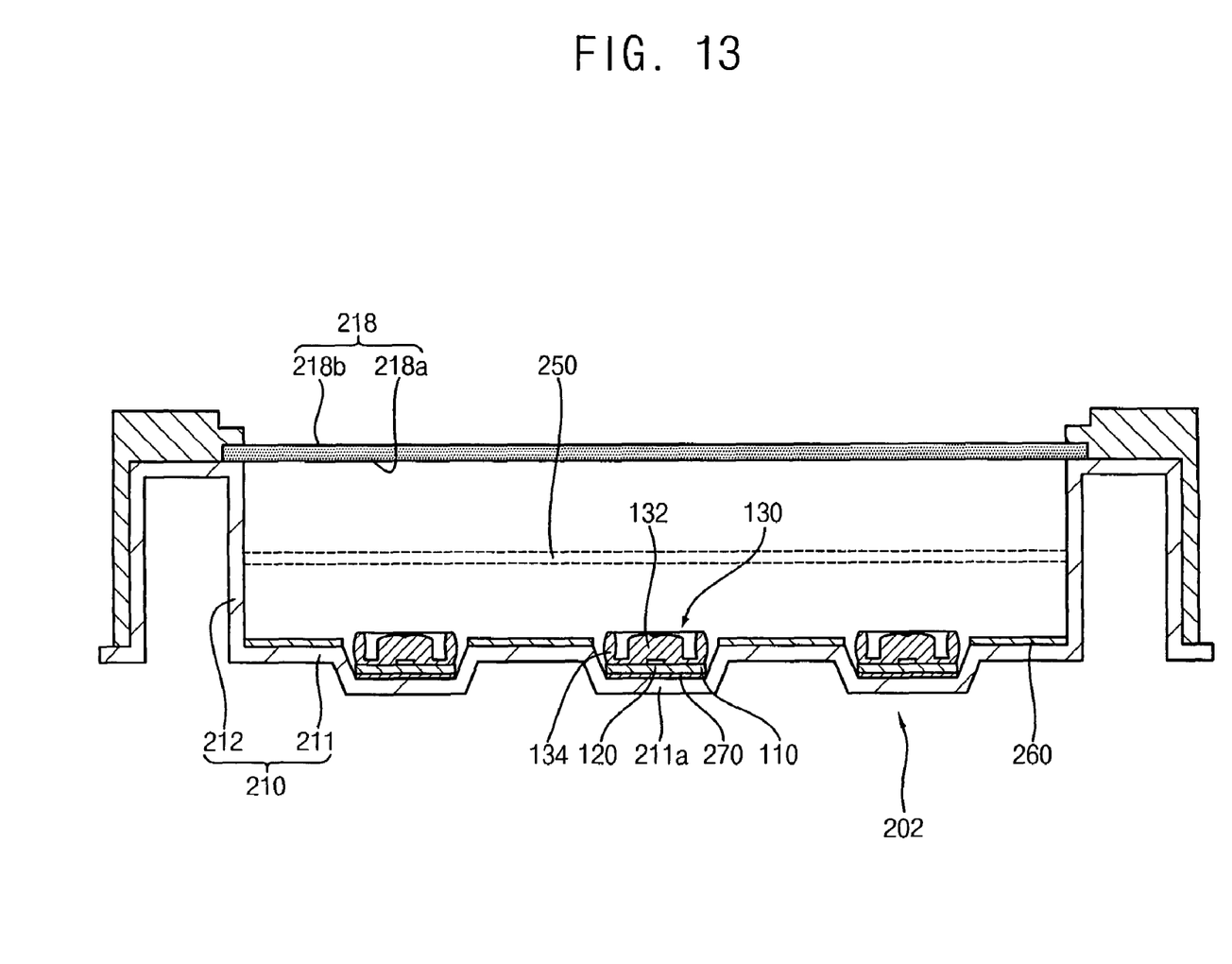
FIG. 13 is a cross-sectional view illustrating a display device according to a seventh exemplary embodiment of the present invention.

FIG. 13 is a cross-sectional view illustrating a display device according to a seventh exemplary embodiment of the present invention.

Referring to FIG. 13, a backlight assembly 202, according to embodiments of the present invention, includes a heat-transferring member 270. The heat-transferring member 270 is interposed between the receiving part 211a formed on the bottom plate 211 of the receiving container 210 and the substrate 110 of the optical module 100. The heat-transferring member 270, in an embodiment of the present invention, has a thin film shape. SpreaderShield™ may be employed as the heat-transferring member 270, which includes composites of natural graphite and may be laminated with metal foils. In an embodiment of the present invention, the heat-transferring member 270 has a thermal conductivity of about 100 W/mK to about 500 W/mK, and has a thickness of about 0.020 inch to about 0.060 inch.

The volume and size of the heat-transferring member 270 are smaller than those of a cooling fin, a cooling pipe, etc. The heat-transferring member 270 has a thermal conductivity greater than that of a cooling fin, a cooling pipe, etc. by a few to tens of times.

The heat-transferring member 270 between the bottom plate 211 of the receiving container 210 and the optical module 100 reduces the size, volume and weight of the receiving container 210.

Figure 14:
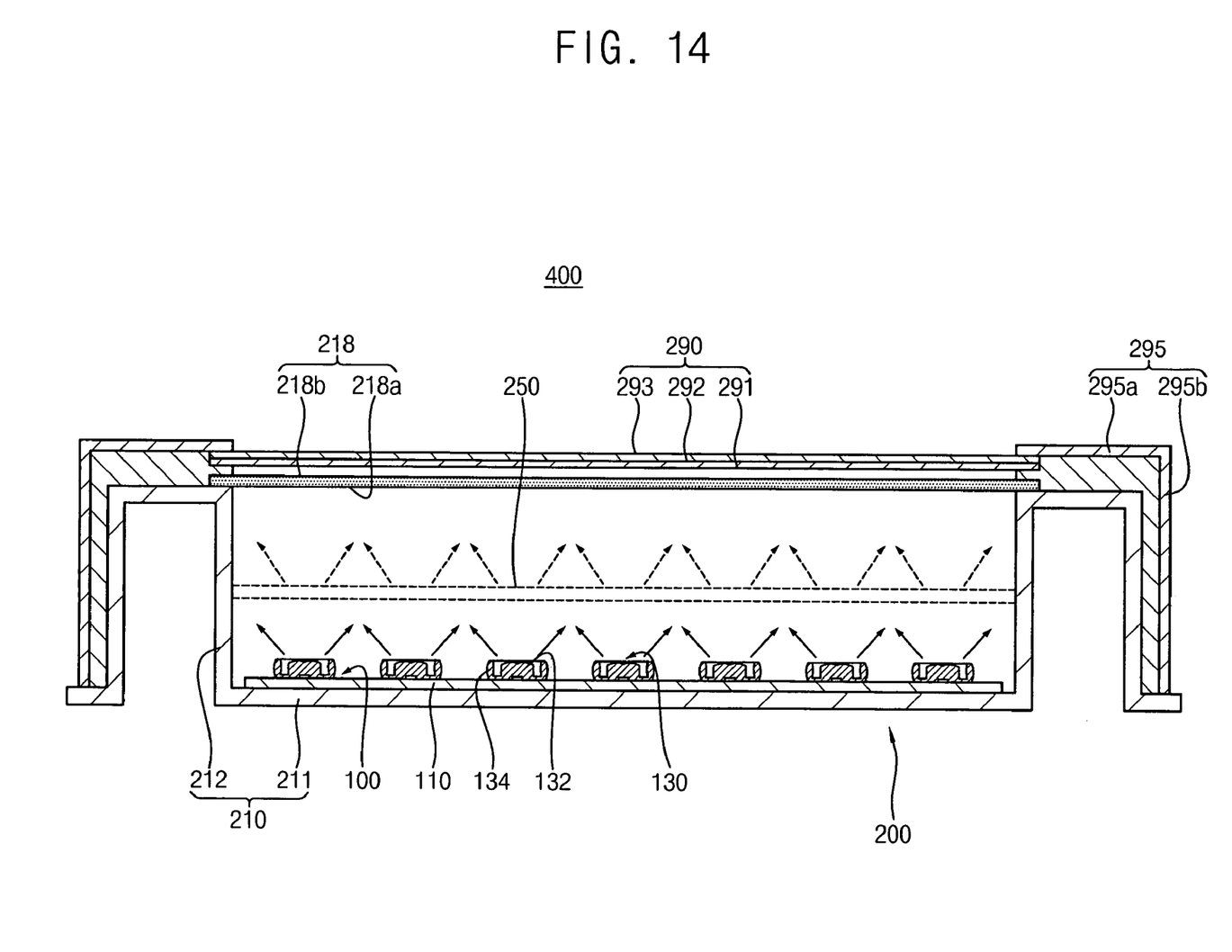
FIG. 14 is a cross-sectional view illustrating a display device according to an eighth exemplary embodiment of the present invention.

FIG. 14 is a cross-sectional view illustrating a display device according to an eighth exemplary embodiment of the present invention.

Referring to FIG. 14, a display device 400 includes a backlight assembly 200 and a display panel 290. The backlight assembly 200 optionally includes a light-mixing member 250 and an optical member 218.

The display panel 290 combined with the receiving container 210, according to embodiments of the present invention, includes a thin film transistor (TFT) substrate 291, a color filter substrate 293 and a liquid crystal layer 292. The TFT substrate 291 includes a pixel electrode and a TFT. The color filter substrate 293 includes a common electrode and a color filter. The liquid crystal layer 292 is interposed between the TFT substrate 291 and the color filter substrate 293.

As shown in FIG. 14, chassis 295 fastens the display panel 290 to the receiving container 210. The chassis 295 includes a first chassis part 295a and a second chassis part 295b. The first chassis part 295a pushes a peripheral portion of the display panel 290, and the second chassis part 295b is extended from the first chassis part 295a. The second chassis part 295b may be coupled to the sidewall of the receiving container 210 using hook combination.

Accordingly, luminance and luminance uniformity of light generated from the point light source are increased. Thus, image display quality of a display panel is improved.

While the processes and apparatus of the present invention have been described in detail for the purpose of illustration, the inventive processes and apparatus are not to be construed as limited thereby. It will be readily apparent to those of reasonable skill in the art that various modifications to the foregoing exemplary embodiments can be made without departing from the spirit and scope of the invention as defined by the appended claims.

What is claimed is:

1. An optical lens system comprising:
a first lens unit including a receiving part receiving a point light source, a lateral face having a cylindrical shape, and an upper face having a dome shape with a concavity facing the receiving part; and
a second lens unit including:
a lens part having a wall shape surrounding the first lens unit, the lens part including an inner lateral face and an outer lateral face, wherein a curvature of the outer lateral face is equal to or larger than that of the inner lateral face; and
a connecting part extended from the inner lateral face of the lens part and having an opening formed thereon, the connecting part connecting the inner lateral face of the lens part to the lateral face of the first lens unit through the opening.

2. An optical lens system comprising:
a first lens part including a receiving part receiving a point light source, a lateral face having a cylindrical shape, and an upper face having a dome shape with a concavity facing the receiving part;
a second lens part having a wall shape surrounding the first lens part, the second lens part including an inner lateral face and an outer lateral face, wherein a curvature of the outer lateral face is equal to or larger than that of the inner lateral face; and
a connecting part connecting the lateral face of the first lens part to the inner lateral face of the second lens part, wherein light from the point light source sequentially passes through the first lens part and the second lens part.

3. The optical lens system of claim 2, wherein the second lens part has a circular tube shape or a cylindrical shape.

4. The optical lens system of claim 2, wherein the second lens part includes a first convex portion formed on the outer lateral face of the second lens part and a second convex portion formed on the inner lateral face of the second lens part.

5. The optical lens system of claim 2, wherein the second lens part includes a convex portion formed on the outer lateral face of the second lens part.

6. The optical lens system of claim 2, wherein the second lens part includes a convex portion formed on the inner lateral face of the second lens part.

7. The optical lens system of claim 2, wherein the connecting part connects an outer lateral face of the first lens part and the inner lateral face of the second lens part.

8. The optical lens system of claim 2, wherein the second lens part has an obtuse angle with respect to the connecting part.

9. The optical lens system of claim 2, wherein a height from an upper face of the connecting part to a vertex of the first lens part is lower than a height from a lower face of the connecting part to an upper face of the second lens part.

10. The optical lens system of claim 2, wherein the first lens part, the second lens part and the connecting part are formed as a single unit.

11. An optical module comprising:
a substrate;
point light sources disposed on the substrate, each of which generates colored light using a power applied thereto through the substrate; and
an optical lens comprising:
a first lens part including a receiving part receiving each of the point light sources, a lateral face having a cylindrical shape, and an upper face having a dome shape with a concavity facing the receiving part;
a second lens part having a wall shape surrounding the first lens part, the second lens part including an inner lateral face and an outer lateral face, wherein a curvature of the outer lateral face is equal to or larger than that of the inner lateral face; and
a connecting part connecting the lateral face of the first lens part to the inner lateral face of the second lens part,
wherein the colored light from each of the point light sources sequentially passes through the first lens part and the second lens part.

12. The optical module of claim 11, wherein the point light sources include a red point light source, a green point light source and a blue point light source.

13. The optical module of claim 11, wherein the second lens part has an obtuse angle with respect to the connecting part.

14. The optical module of claim 11 wherein the second lens part includes a convex portion formed on the outer lateral face of the second lens unit.

15. The optical module of claim 11, wherein the second lens part includes a convex portion formed on the inner lateral face of the second lens unit.

16. The optical lens system of claim 11, wherein a height of the first lens part is less than a width of the first lens part, and a height of the second lens part is greater than a width of the second lens part.

17. The optical module of claim 16, wherein the first lens part expands the colored light emitted from the point light source in a first direction, and the second lens part expands the expanded colored light in a second direction that is different from the first direction.

18. A backlight assembly comprising:
an optical module comprising:
a substrate;
point light sources disposed on the substrate, each of which generates colored light using a power applied thereto through the substrate; and
an optical lens including:
a first lens part including a receiving part receiving each of the point light sources, a lateral face having a cylindrical shape, and an upper face having a dome shape with a concavity facing the receiving part;
a second lens part having a wall shape surrounding the first lens part, the second lens part including an inner lateral face and an outer lateral face, wherein a curvature of the outer lateral face is equal to or larger than that of the inner lateral face; and
a connecting part connecting the lateral face of the first lens part to the inner lateral face of the second lens part, wherein the colored light from each of the point light sources sequentially passes through the first lens part and the second lens part; and
a receiving container receiving the optical module.

19. The backlight assembly of claim 18, wherein the second lens part includes a first convex portion formed on the outer lateral face of the second lens part and a second convex portion formed on the inner lateral face of the second lens part.

20. The backlight assembly of claim 18, wherein the receiving container includes a light-diffusing plate diffusing white light.

21. The backlight assembly of claim 18, wherein the receiving container includes a light-mixing member mixing the colored light generated from the optical module.

22. The backlight assembly of claim 18, wherein the receiving container includes a receiving part formed on a bottom plate of the receiving container to receive the optical module.

23. The backlight assembly of claim 22, wherein the receiving container includes a heat-transferring member interposed between the optical module and the receiving part, the heat-transferring member having a thin film shape.

24. A display device comprising:
an optical module comprising:
a substrate;
point light sources disposed on the substrate, each of which generates light using a power applied thereto through the substrate; and
an optical lens including:
a first lens part including a receiving part receiving each of the point light sources, a lateral face having a cylindrical shape, and an upper face having a dome shape with a concavity facing the receiving part;
a second lens part having a wall shape surrounding the first lens part, the second lens part including an inner lateral face and an outer lateral face, wherein a curvature of the outer lateral face is equal to or larger than that of the inner lateral face; and
a connecting part connecting the lateral face of the first lens part to the inner lateral face of the second lens part, wherein the light from each of the point light sources sequentially passes through the first lens part and the second lens part;

a receiving container configured to receive the optical module;

a light-diffusing plate disposed over the optical module to diffuse the light; and a display panel disposed over the light-diffusing plate, the display panel displaying an image using the diffused light.

25. The display device of claim 24, further comprising a light-mixing member disposed between the optical module and the light-diffusing member to mix the light generated from the optical module to generate white light.

* * * * *